(12) United States Patent
Jenne

(10) Patent No.: US 7,277,347 B2
(45) Date of Patent: Oct. 2, 2007

(54) ANTIFUSE CAPACITOR FOR CONFIGURING INTEGRATED CIRCUITS

(75) Inventor: Fredrick B. Jenne, Los Gatos, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 109 days.

(21) Appl. No.: 11/169,986

(22) Filed: Jun. 28, 2005

(65) Prior Publication Data
US 2007/0008800 A1    Jan. 11, 2007

(51) Int. Cl.
*G11C 17/18* (2006.01)
(52) U.S. Cl. .................... 365/225.7; 365/202; 365/243
(58) Field of Classification Search ............ 365/225.7, 365/202, 243; 257/202
See application file for complete search history.

(56) References Cited

U.S. PATENT DOCUMENTS 6,545,928 B1 * 4/2003 Bell .................... 365/225.7
2004/0232446 A1 * 11/2004 Nishimura et al. ......... 257/202
2005/0007855 A1    1/2005 Lee et al.

OTHER PUBLICATIONS

Ben Kaczer, et al. "Consistent Model for Short-Channel nMOSFET After Hard Gate Oxide Breakdown", IEEE Transactions on Electron Devices, vol. 49, No. 3, Mar. 2002, pp. 507-513.

* cited by examiner

*Primary Examiner*—Richard T. Elms
*Assistant Examiner*—Pho M. Luu
(74) *Attorney, Agent, or Firm*—Okamoto & Benedicto, LLP

(57) ABSTRACT

An antifuse cell includes a select transistor, a blocking transistor, and an antifuse. The select transistor allows for selection of the antifuse cell among an array of antifuse cells, while the blocking transistor limits the amount of voltage that may be directly applied to the select transistor. The antifuse including a capacitor. The capacitor may include a gate over a gate oxide and an n-well under the gate oxide. The n-well may have two n+ regions used as contact points for the n-well. Upon programming, an electrically conductive path (e.g., a short) is permanently burned through the gate oxide. The antifuse cell occupies a relatively small area while providing a relatively tight read current distribution.

15 Claims, 6 Drawing Sheets

ANTIFUSE CAPACITOR FOR CONFIGURING INTEGRATED CIRCUITS

BACKGROUND OF THE INVENTION

1. Field of the Invention

The present invention relates generally to integrated circuits, and more particularly but not exclusively to antifuse cells.

2. Description of the Background Art

Some integrated circuits may be configured in the field or the factory after fabrication. Examples of these integrated circuits include programmable logic devices (PLD), field programmable gate arrays (FPGA), read only memories (ROM), and clock circuits. An integrated circuit may be configured by "programming" (also referred to as "burning") information into it. Programming may involve blowing a fuse that connects two nodes of a circuit. The status of the fuse, i.e., whether it is open or shorted, may be determined by flowing read current through the nodes. An antifuse configures an integrated circuit in a manner opposite to that of a fuse. An antifuse provides an open circuit in a normal state, and provides a short when burned. The state of an antifuse may be read in a manner similar to that of a fuse.

Generally speaking, it is advantageous to have an antifuse that occupies a relatively small area and that has relatively tight read current distribution.

SUMMARY

In one embodiment, an antifuse cell includes a select transistor, a blocking transistor, and an antifuse. The select transistor allows for selection of the antifuse cell among an array of antifuse cells, while the blocking transistor limits the amount of voltage that may be directly applied to the select transistor. The antifuse may comprise a capacitor. The capacitor may include a gate over a gate oxide and an n-well under the gate oxide. The n-well may have two n+ regions used as contact points for the n-well. Upon programming, an electrically conductive path (e.g. a short) is permanently burned through the gate oxide. The antifuse cell occupies a relatively small area while providing a relatively tight read current distribution.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
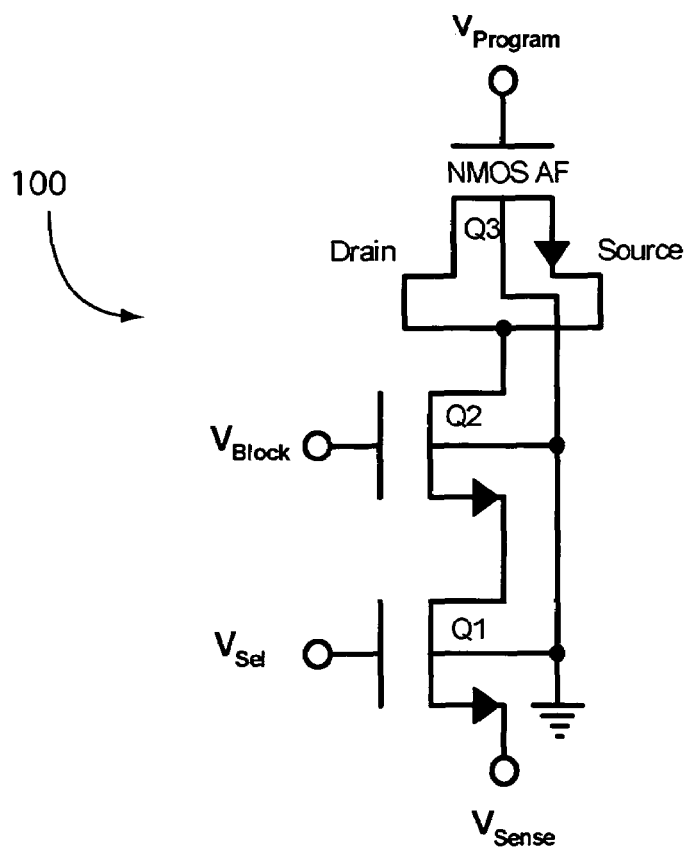
FIG. 1 schematically shows an example three transistor antifuse cell employing an NMOS transistor antifuse.

An antifuse is typically implemented as a cell in an array of antifuse cells. An example antifuse cell 100 is schematically shown in FIG. 1. In the example of FIG. 1, the antifuse cell 100 includes a select transistor Q1, a blocking transistor Q2, and an antifuse transistor Q3. The antifuse cell 100 is also referred to as a three transistor antifuse cell in that it consists of three transistors, including the antifuse itself. In the antifuse cell 100, a blocking voltage ($V_{BLOCK}$) is always applied on the gate of the transistor Q2 to prevent a relatively high programming voltage ($V_{PROGRAM}$) from being applied directly on the select transistor Q1. To program the antifuse cell 100, a programming voltage is applied on the gate of the antifuse transistor Q3 while a selection voltage ($V_{SELECT}$) is applied to the gate of the transistor Q1 and a low voltage (e.g. 0 volt or ground) is applied to the source of the select transistor Q1. This turns ON the select transistor Q1 and allows current through to flow through the gate oxide of antifuse transistor Q3, thereby burning a short through the gate oxide. The state of the antifuse transistor Q3 may be read by applying a voltage on the gate of the transistor Q2 and antifuse transistor Q3, applying a selection voltage on the gate of the select transistor Q1, and then reading the resulting current on the source of the select transistor Q1. If the antifuse transistor Q3 is burned, a resistive short allows current to flow from the gate of the transistor Q3 to the source of the select transistor Q1. Otherwise, there will be no current flow, indicating that the antifuse transistor Q3 has not been programmed and thus remains open.

Figure 2:
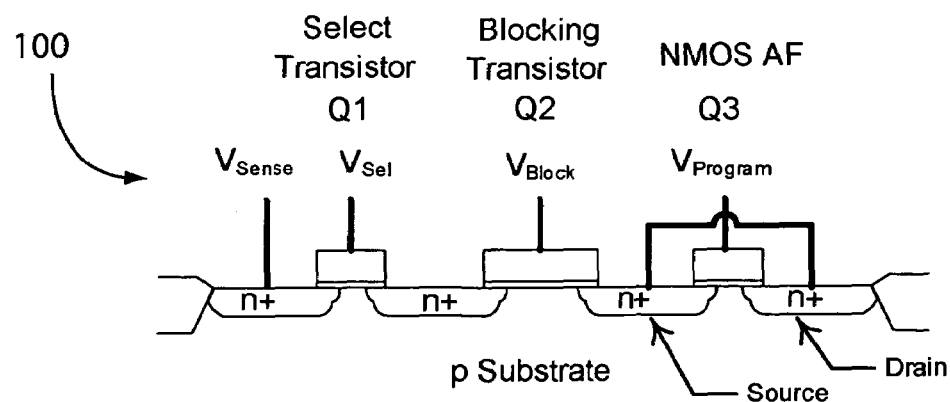
FIG. 2 schematically shows a cross-sectional view of an integrated circuit having the antifuse cell of FIG. 1.

FIG. 2 schematically shows a cross-sectional view of an integrated circuit having the antifuse cell 100. As shown in FIG. 2, the select transistor Q1 and the blocking transistor Q2 comprise NMOS transistors with n+ (i.e., heavily doped with an n-type dopant) regions for source and drain. Similarly, the antifuse transistor Q3 is an NMOS transistor having n+ source and drain regions that are shorted together. The antifuse cell 100 is formed on a p-type substrate. An n-channel is thus formed between the source and drain regions of the antifuse transistor Q3 when a positive voltage applied to its gate exceeds its threshold voltage.

Figure 3:
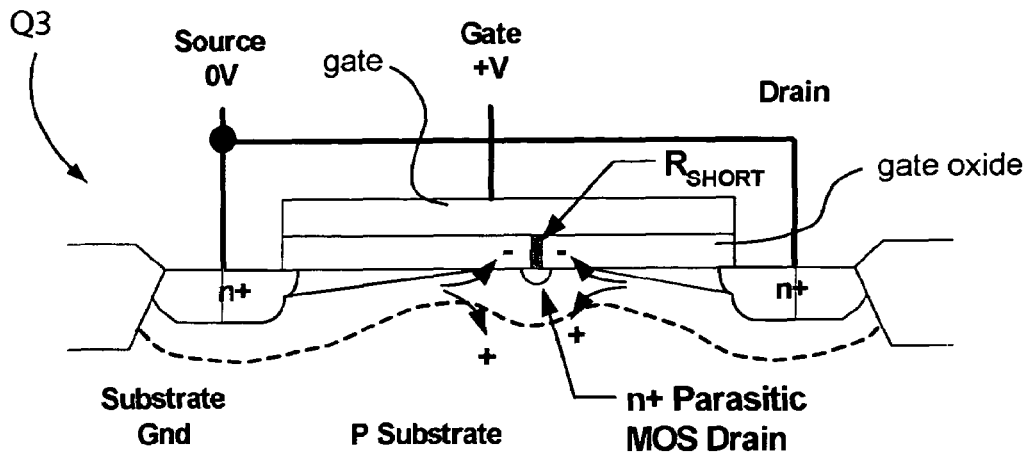
FIG. 3 schematically shows a cross-sectional view of the antifuse transistor of the antifuse cell of FIG. 1.

FIG. 3 schematically shows a cross-sectional view of the antifuse transistor Q3. Programming the antifuse transistor Q3 results in a resistive short ($R_{SHORT}$) being formed through the gate oxide. The resistive short may be read as previously described above. One problem with the antifuse transistor Q3 is that a diode forms through the resistive short. This diode forms a parasitic NMOS drain region that injects charge into the gate oxide during programming, resulting in a large undesirable distribution in threshold voltage and thus read current.

Figure 4:
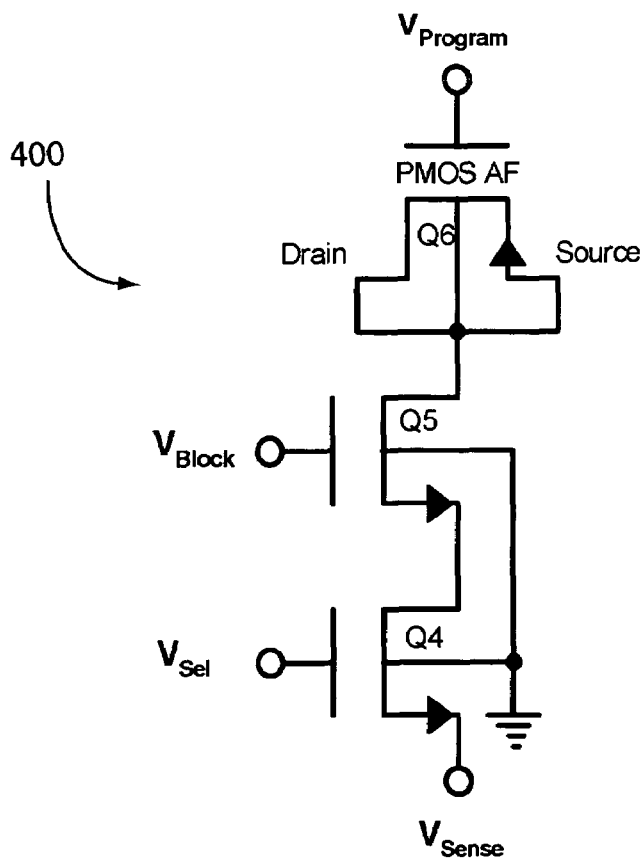
FIG. 4 schematically shows an example three transistor antifuse cell employing a PMOS transistor antifuse.

To eliminate the charge injection problem of the antifuse transistor Q3, a PMOS antifuse transistor may be employed as shown in the antifuse cell 400 of FIG. 4. The antifuse cell 400 is a three transistor antifuse cell that includes a select transistor Q4, a blocking transistor Q5, and an antifuse transistor Q6. The functionality and operation of the select transistor Q4 and the blocking transistor Q5 are similar to those of the select transistor Q1 and the blocking transistor Q2, respectively, of the previously described antifuse cell 100. The programming and reading of the antifuse cell 400 are also similar to those of the antifuse cell 100.

Figure 5:
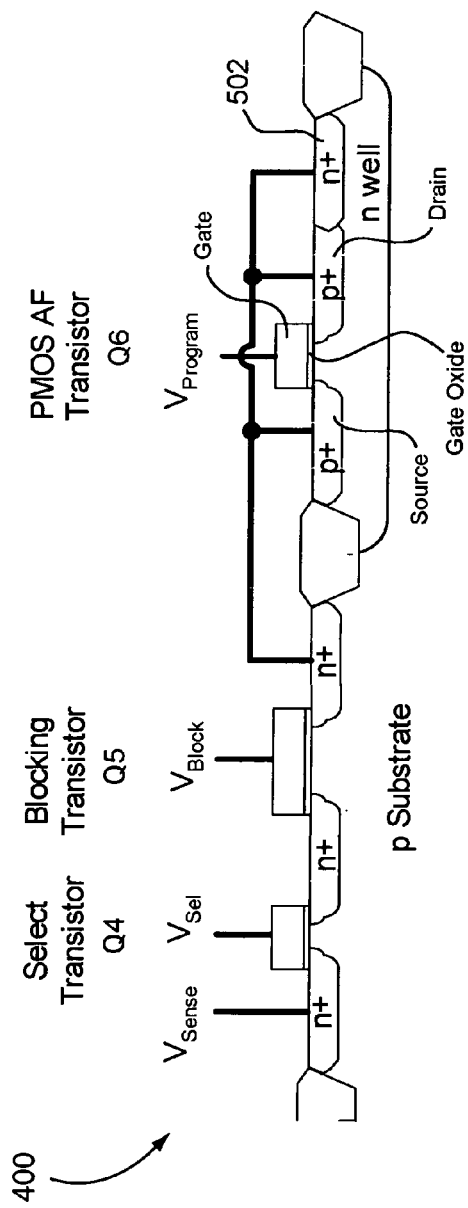
FIG. 5 schematically shows a cross-sectional view of an integrated circuit having the antifuse cell of FIG. 4.

FIG. 5 schematically shows a cross-sectional view of an integrated circuit having the antifuse cell 400. As shown in FIG. 5, the select transistor Q4 and the blocking transistor Q5 comprise NMOS transistors with n+ source and drain regions. The antifuse transistor Q6, on the other hand, comprises a PMOS transistor with p+ (i.e., heavily doped with a p-type dopant) source and drain regions. Upon programming, a resistive short (not shown) is burned through the gate oxide of the antifuse transistor Q6. To allow reading of the short, an n+ region 502 is formed in the same n-well where the p+ source and drain regions of the antifuse transistor Q6 are formed. The n+ region 502 is tied to the p+ source and drain regions of the antifuse transistor Q6 and to the drain of the blocking transistor Q5. This allows a reading voltage to be applied on the gate of the antifuse transistor Q6 and flow current through the resistive short in the gate oxide, the n+ region 502, the drain of the blocking transistor Q5 and so on.

Figure 6:
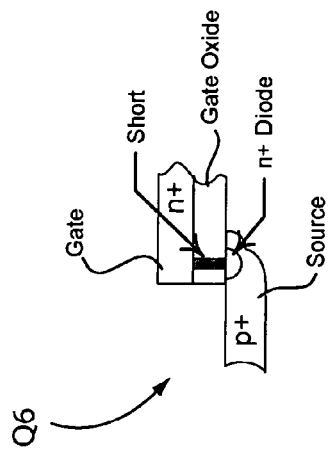
FIG. 6 schematically illustrates a possible problem with the antifuse transistor of the antifuse cell of FIG. 4.

One problem with the antifuse cell 400 is that the antifuse transistor Q6 requires a relatively large amount of silicon area. Another problem with the antifuse cell 400 is that the antifuse transistor Q6 may become defective when the resistive short is burned between the gate oxide and a p+ source/drain region instead of in the middle of the gate oxide. This problem is illustrated in FIG. 6, which shows a cross-section of a portion of the antifuse transistor Q6. In example of FIG. 6, a resistive short is burned through the gate oxide in a way that connects the p+ source region to the gate. The resistive short forms a diode to the source instead of a low resistance path to the n-well, thereby rendering the antifuse cell 400 defective.

Figure 7:
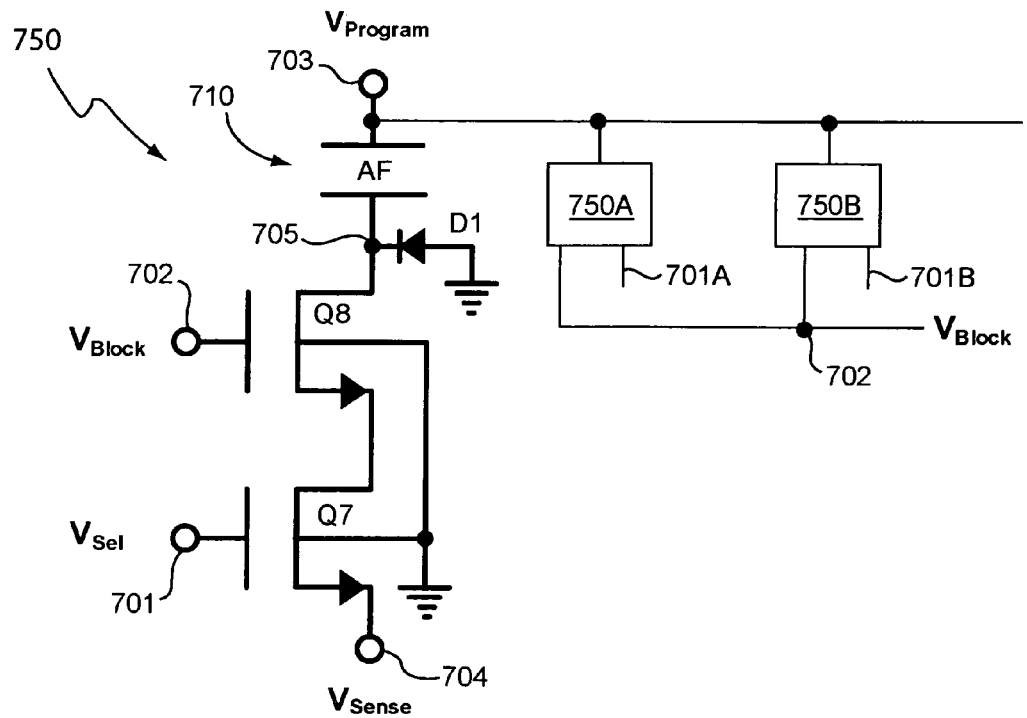
FIG. 7 schematically shows an antifuse cell in accordance with an embodiment of the present invention.

Referring now to FIG. 7, there is schematically shown an antifuse cell 750 in accordance with an embodiment of the present invention. In the example of FIG. 7, the antifuse cell 750 is a cell in an array of antifuse cells that includes antifuse cells 750A, 750B, and so on. In the example of FIG. 7, all antifuse cells in the array of antifuse cells are tied to the same blocking voltage $V_{BLOCK}$ at a common node 702. Each antifuse cell in the array of antifuse cells receives its own selection voltage $V_{SELECT}$ at a particular selection node. In the example of FIG. 7, the antifuse cell 750 receives its selection voltage at a node 701, the antifuse cell 750A receives its selection voltage at a node 701A, the antifuse cell 750B receives its selection voltage at a node 701B, and so on. Applying a selection voltage at a particular antifuse cell selects that cell for operation (e.g., reading or programming).

Antifuse cell 750 is the same as the other antifuse cells (i.e. 750A, 750B, . . . ) in the array, and will be used as an example in this disclosure. In the example of FIG. 7, the antifuse cell 750 comprises a select transistor Q7, a blocking transistor Q8, and an antifuse 710. As will be more apparent below, the antifuse 710 comprises one or more diodes D1 and a capacitor. The blocking voltage $V_{BLOCK}$ (e.g. 3.3 volts) is tied to the gate of all the blocking transistors in the array to turn ON the blocking transistors and prevent a relatively high programming voltage $V_{PROGRAM}$ (e.g. 7.5 volts) from being applied directly to corresponding select transistors. Using antifuse cell 750 as an example, turning ON the blocking transistor Q8 allows for current to flow from the antifuse 710 to the select transistor Q7 while preventing the programming voltage $V_{PROGRAM}$ at a node 703 from being applied directly to the transistor Q7. The blocking transistor Q8 thus prevents the relatively thin gate oxide of the select transistor Q7 from breaking down during programming. This advantageously allows the antifuse cell 750 to be readily employed in a variety of circuitry, even pre-existing ones with relatively thin gate oxides, with minimal or no process integration requirement. In one embodiment, the blocking transistor Q8 is always ON during normal operation.

To program the antifuse cell 750, the antifuse cell 750 is selected by turning ON the select transistor Q7. In one embodiment, the select transistor Q7 is turned ON by applying a selection voltage $V_{SELECT}$ (e.g. 1.8 volts) on its gate at the node 701. The node 704 is placed at ground potential and a programming voltage $V_{PROGRAM}$ (e.g. 7.5 volts) is applied at the node 703. This results in the node 705 being pulled to ground and the programming voltage being applied across the antifuse 710, and current flowing from the node 703, through the antifuse 710, through the blocking transistor Q8, through the select transistor Q7, and to the node 704. The current flow through the antifuse 710 burns an electrically conductive path, in this case a short, through the antifuse 710 between the node 703 and a node 705. The antifuse 710 is also referred to as a one-time-programmable (OTP) antifuse in that the short permanently remains after programming.

To determine the state of the antifuse cell 750, the antifuse cell 750 is again selected by turning ON the select transistor Q8. A read voltage (e.g. 1.8 volts) is applied on the node 703 and a sense voltage $V_{SENSE}$ (or corresponding read current) is detected at the node 704. If the antifuse 710 is burned (i.e. there is a short between nodes 703 and 705), current will flow from the node 703 to the node 704. Otherwise, the antifuse 710 will be open, preventing current flow to the node 704. The sense voltage $V_{SENSE}$ will vary depending on whether the antifuse 710 is burned or not.

Figure 8:
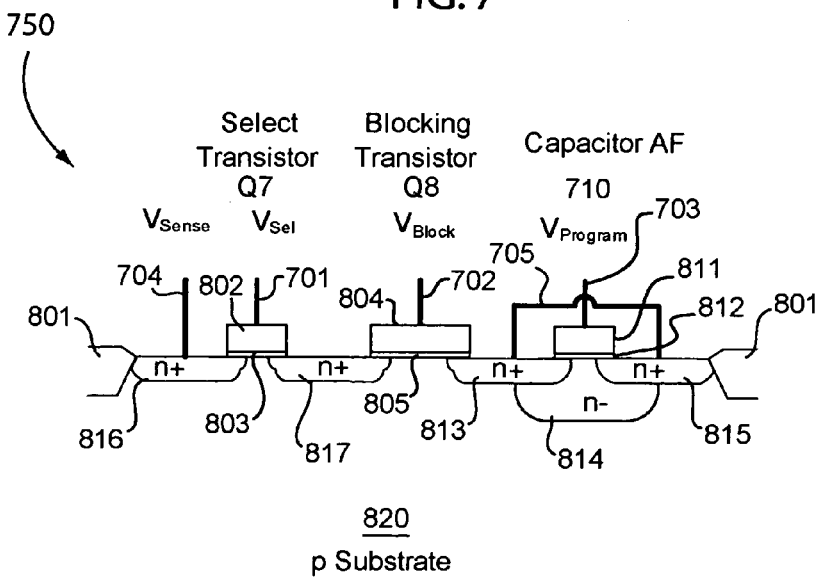
FIG. 8 shows a cross-sectional view of an integrated circuit having the antifuse cell of FIG. 7.

FIG. 8 shows a cross-sectional view of an integrated circuit having the antifuse cell 750 in accordance with an embodiment of the present invention. In the example of FIG. 8, the antifuse cell 750 is formed in a p-type semiconductor substrate 820. Shallow trench isolation (STI) structures 801 separate the antifuse cell 750 from other circuitry on the substrate 820. In the example of FIG. 8 (and FIG. 7), the select transistor Q7 and the blocking transistor Q8 are NMOS transistors. Accordingly, the select transistor Q7 and blocking transistor Q8 have n+ source and drain regions. In one embodiment, the select transistor Q7 has a polysilicon gate 802 that is about 2700 Angstroms thick and a gate oxide 803 that is about 32 Angstroms thick. The select transistor Q7 has an n+ source 816 connected to the node 704 used for detecting a sense voltage (or read current). The select transistor Q7 uses an n+ region 817 as a drain, which is also used by the blocking transistor Q8 as a source. Applying a positive selection voltage that exceeds a threshold voltage at the node 701 forms an n-channel between the n+ regions 816 and 817 to allow current flow and thus select the antifuse cell 750.

In one embodiment, the blocking transistor Q8 has a polysilicon gate 804 that is about 1800 Angstroms thick and a gate oxide 805 that is about 55 Angstroms thick. The blocking transistor Q8 uses the n+ region 817 as a source and the n+ region 813 as a drain. Applying a positive voltage that exceeds a threshold voltage at the node 702 forms an n-channel between n+ regions 817 and 813. This allows current flow to the select transistor Q7 while preventing direct application of a relatively high voltage thereto.

As mentioned, the antifuse 710 may comprise a capacitor and one or more diodes. The capacitor, which is also referred to herein as "antifuse capacitor," is formed by a gate 811, a gate oxide 812, and an n-well 814. The gate 811, the gate oxide 812, and the n-well 814 serve as the capacitor top plate, dielectric, and bottom plate, respectively. A lightly doped n-well 814 (n−) electrically connects the n+ regions 813 and 815. Because of this connection, n+ regions 813 and 815 are not serving as source and drain regions in the antifuse 710. Put another way, the antifuse 710 has no source or drain. The n+ regions 813 and 815, which serve as contact points to the n-well 814 (i.e. the bottom plate of the capacitor), are tied together to the node 705 (see also FIG. 7). Note that the n+ region 813 also serves as the drain of the blocking transistor Q8. This means that the bottom plate of the antifuse capacitor is tied to the drain of the blocking transistor Q8. A short through the gate oxide 812 thus results in a relatively very low resistance path (e.g. about 5 kilo-ohms) from the node 703 to the node 705.

There are several diodes formed in the antifuse 710. One diode is formed by the n+ region 813 and the p-type substrate 820, another diode is formed by the n-well 814 and the p-type substrate 820, and yet another diode is formed by the n+ region 815 and the p-type substrate 820. The p-type substrate 820, which serves as the anode of these diodes, provides a connection to ground (see anode of the diode D1 in FIG. 7). The cathode (i.e., n+ region 813, n-well 814, and n+ region 815) of these diodes are all tied to the node 705 (see cathode of the diode D1 in FIG. 7). These diodes are represented by the diode D1 in FIG. 7.

Figure 9:
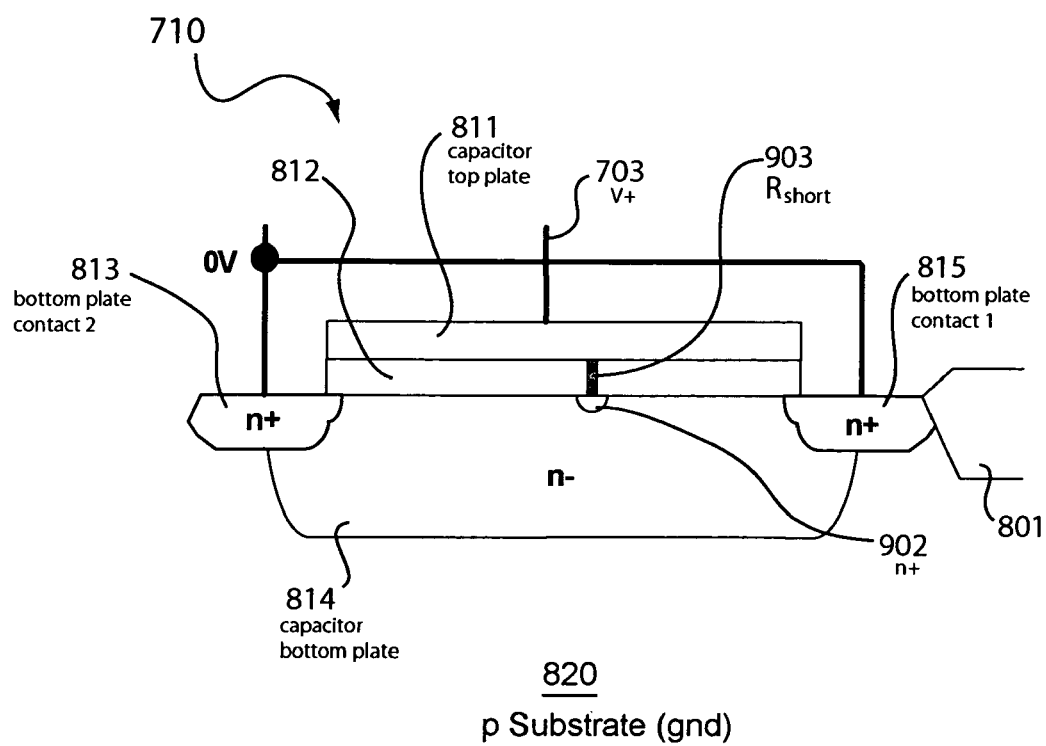
FIG. 9 schematically shows a closer view of an antifuse in the antifuse cell shown in FIG. 8.

FIG. 9 schematically shows a closer view of the antifuse 710. In one embodiment, the gate 811 comprises polysilicon formed to a thickness of about 1800 Angstroms and the gate oxide 812 is formed to a thickness of about 32 Angstroms. Applying a positive programming voltage on the gate 811 at the node 703 during programming burns a resistive short 903 ($R_{SHORT}$; e.g. a resistance of about 5 kilo-ohm) through the gate oxide 812. An n+ region 902 may form on the end of the resistive short 903. However, the n+ region 902 has no adverse effect because it has the same polarity as the n-well 814. The other reference labels shown in FIG. 9 have been previously discussed and are provided for reference purposes.

Figure 10:
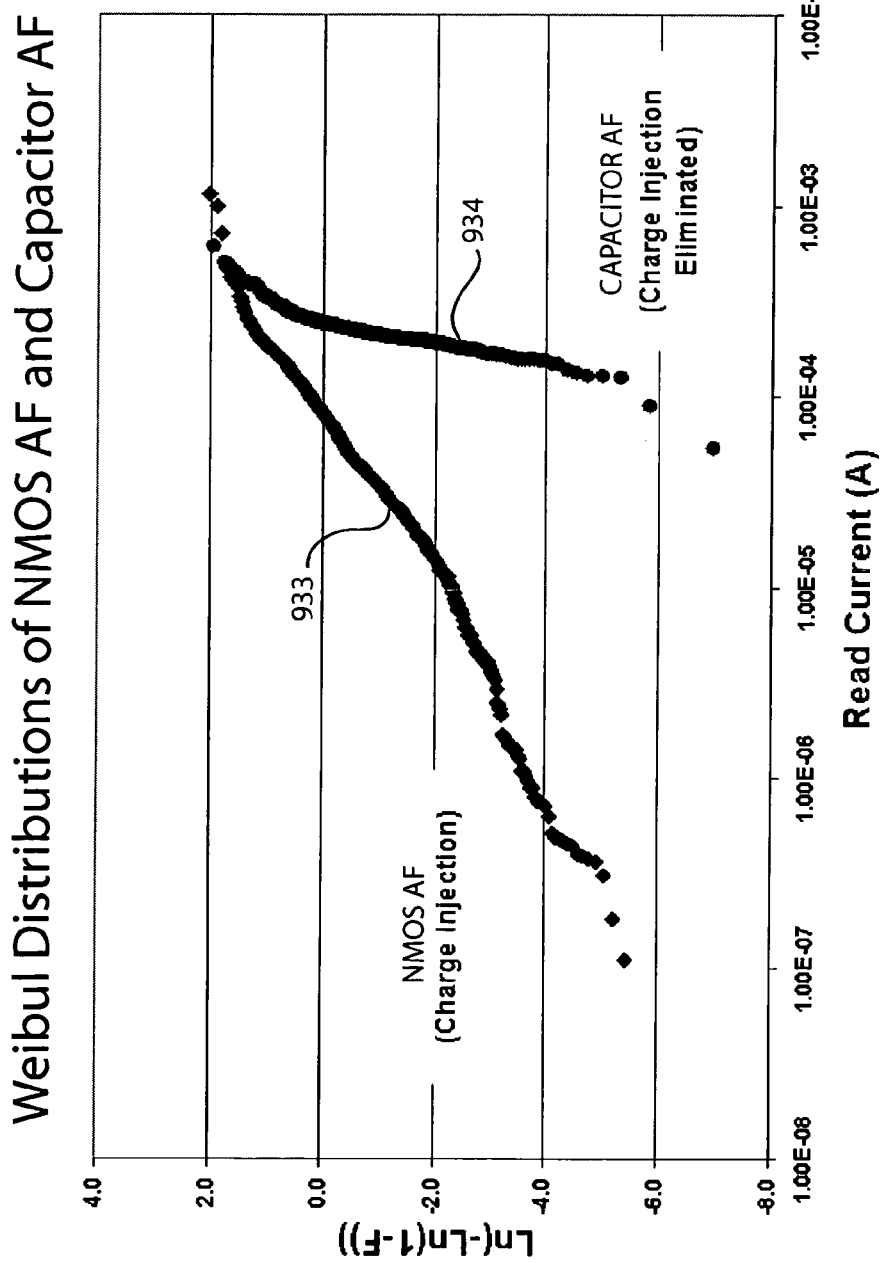
FIG. 10 shows Weibul distributions comparing the antifuse cell of FIG. 7 to the antifuse cell of FIG. 1.

One advantage of the antifuse cell 750 is that it provides a relatively tight read current distribution compared to antifuse cells employing an NMOS antifuse transistor. The capacitor of the antifuse 710 eliminates the saturated drain region charge injection issue that has plagued NMOS antifuse transistors. FIG. 10 shows example Weibul distributions of read currents for an antifuse cell 100 (i.e. with an NMOS antifuse transistor) and an antifuse cell 750 (i.e. with an antifuse capacitor). The plot 933 is for the antifuse cell 100, while the plot 934 is for the antifuse cell 750. From FIG. 10, it can be seen that the antifuse cell 100 has a larger read current tail compared to the antifuse cell 750.

Another advantage of the antifuse cell 750 is that it requires a relatively small area compared to antifuse cells employing a PMOS antifuse transistor. Comparing FIG. 5 to FIG. 8, the antifuse cell 400 requires a relatively large area because it needs the n+ region 502 to connect the burned resistive short to the rest of the cell. In some cases, the antifuse cell 400 may require about 30% more space compared to the antifuse cell 750. The increased space requirement of the antifuse cell 400 leads to higher per die cost and smaller number of devices on the wafer. Furthermore, in the antifuse cell 750, a short may be burned through the gate oxide to connect the gate to a highly doped region (n+ in the case of the antifuse 710) without rendering the antifuse cell 750 defective.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. An antifuse cell comprising:
    an antifuse comprising a capacitor, the capacitor having a first end and a second end, the first end of the capacitor being configured to receive a programming voltage to burn an electrically conductive path through the capacitor when the antifuse cell is selected;
    a select transistor configured to allow selection of the antifuse cell among a plurality of antifuse cells;
    a blocking transistor configured to limit an amount of voltage applied to the select transistor; and
    a diode having a cathode end coupled to the second end of the capacitor and an anode end coupled to ground.

2. The antifuse cell of claim 1 wherein the second end of the of the capacitor is coupled to a drain of the blocking transistor, a drain of the select transistor is coupled to a source of the blocking transistor, and a source of the select transistor allows for sensing of a state of the antifuse.

3. A method of operating an antifuse cell of an integrated circuit, the method comprising:
    selecting an antifuse cell of an integrated circuit, the antifuse cell comprising an antifuse; and
    applying a programming voltage to a first end of the antifuse, the antifuse comprising a gate, a gate oxide under the gate, an n-well under the gate oxide, and a first n+ region and a second n+ region separated by the n-well, the programming voltage burning a short through the gate oxide to connect the gate to the n-well.

4. The method of claim 3 further comprising:
    preventing the programming voltage from being directly applied to a transistor used to select the antifuse cell.

5. The method of claim 3 wherein the first and second n+ regions are shorted together.

6. The method of claim 3 further comprising reading a state of the antifuse by applying a read voltage on the first end of the antifuse and detecting a sense voltage on a node of the antifuse.

7. An antifuse cell operable using the method of claim 3.

8. An antifuse cell comprising:
    capacitor means for creating a short through a gate oxide in response to a signal to program the antifuse cell, the capacitor means comprising a capacitor;
    first transistor means for selecting the antifuse cell for programming or reading; and
    second transistor means for limiting an amount of voltage applied to the select means.

9. The antifuse cell of claim 8 wherein the capacitor means comprises two active n+ regions separated by an n-well.

10. The antifuse cell of claim 8 wherein the first and second transistor means comprise NMOS transistors.

11. An antifuse cell comprising:
    an antifuse comprising a capacitor, the capacitor having a first end and a second end, the first end of the capacitor being configured to receive a programming voltage to burn an electrically conductive path through the capacitor when the antifuse cell is selected;
a select transistor configured to allow selection of the antifuse cell among a plurality of antifuse cells;
a blocking transistor configured to limit an amount of voltage applied to the select transistor;
a polysilicon gate serving as a top plate of the capacitor;
a gate oxide under the polysilicon gate; and
an n-well under the gate oxide, the n-well serving as a bottom plate of the capacitor.

12. The antifuse cell of claim 11 further comprising:
a first n+ region; and
a second n+ region, wherein the n-well lies between the first and second n+ regions.

13. The antifuse cell of claim 12 wherein the first and second n+ regions are shorted together.

14. The antifuse cell of claim 12 wherein the polysilicon gate is the first end of the capacitor.

15. The antifuse cell of claim 13 wherein the capacitor is coupled to ground by way of a p-type substrate where the capacitor is formed.

* * * * *